(12) United States Patent  (10) Patent No.: US 8,017,872 B2
Cripe et al.  (45) Date of Patent: Sep. 13, 2011

(54) SYSTEM AND METHOD FOR PROPORTIONAL COOLING WITH LIQUID METAL

(75) Inventors: David W. Cripe, Mount Vernon, IA (US); Bryan S. McCoy, Cedar Rapids, IA (US); Nathan P. Lower, North Liberty, IA (US); Ross K. Wilcoxon, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 308 days.

(21) Appl. No.: 12/284,670

(22) Filed: Sep. 24, 2008

(65) Prior Publication Data

US 2009/0279259 A1  Nov. 12, 2009

Related U.S. Application Data

(63) Continuation-in-part of application No. 12/116,126, filed on May 6, 2008.

(51) Int. Cl.
*H05K 1/00* (2006.01)
(52) U.S. Cl. ......... 174/252; 174/260; 361/720; 361/721
(58) Field of Classification Search .................. 174/256; 361/699
See application file for complete search history.

(56) References Cited

U.S. PATENT DOCUMENTS

| 3,508,974 A * | 4/1970 | Bressler ........................ 136/205 |
| 3,654,528 A | 4/1972 | Barkan |
| 3,812,404 A | 5/1974 | Barkan et al. |
| 4,177,015 A | 12/1979 | Davidson |
| 4,294,658 A | 10/1981 | Humphreys et al. |
| 4,410,874 A | 10/1983 | Scapple et al. |
| 4,505,644 A | 3/1985 | Meisner et al. |
| 4,560,084 A | 12/1985 | Wolfson |
| 4,572,924 A | 2/1986 | Wakely et al. |
| 4,622,433 A | 11/1986 | Frampton |
| 4,761,518 A | 8/1988 | Butt et al. |
| 4,765,948 A | 8/1988 | DeLuca et al. |
| 4,773,826 A | 9/1988 | Mole |
| 4,802,531 A | 2/1989 | Nathenson et al. |
| 4,882,212 A | 11/1989 | SinghDeo et al. |

(Continued)

FOREIGN PATENT DOCUMENTS

JP  2003-332505 A  11/2003

OTHER PUBLICATIONS

U.S. Appl. No. 12/283,563, filed Sep. 12, 2008, Lower et al.

(Continued)

*Primary Examiner* — Jeremy C Norris
*Assistant Examiner* — Tremesha Willis
(74) *Attorney, Agent, or Firm* — Daniel M. Barbieri

(57) ABSTRACT

A circuit board may include a pump and a channel. The channel may include a liquid metal and a coating. The liquid metal may be pumped through the channel by the pump and the coating reduces diffusion and chemical reaction between the liquid metal and at least portions of the channel. The liquid metal may carry thermal energy to act as a heat transfer mechanism between two or more locations on the substrate. The substrate may include electrical interconnects to allow electrical components to be populated onto the substrate to form an electronics assembly. The pump may be driven by electric current that is utilized by one or more electronic components on the circuit board.

17 Claims, 10 Drawing Sheets

U.S. PATENT DOCUMENTS

| | | | |
|---|---|---|---|
| 5,041,342 | A | 8/1991 | Umeda et al. |
| 5,140,109 | A | 8/1992 | Matsumoto et al. |
| 5,184,211 | A | 2/1993 | Fox |
| 5,195,231 | A | 3/1993 | Fanning et al. |
| 5,265,136 | A | 11/1993 | Yamazaki et al. |
| 5,315,155 | A | 5/1994 | O'Donnelly et al. |
| 5,702,963 | A | 12/1997 | Vu et al. |
| 5,863,605 | A | 1/1999 | Bak-Boychuk et al. |
| 5,958,794 | A | 9/1999 | Bruxvoort et al. |
| 5,991,351 | A | 11/1999 | Woolley |
| 6,010,956 | A | 1/2000 | Takiguchi et al. |
| 6,019,165 | A | 2/2000 | Batchelder |
| 6,021,844 | A | 2/2000 | Batchelder |
| 6,048,656 | A | 4/2000 | Akram et al. |
| 6,110,656 | A | 8/2000 | Eichorst et al. |
| 6,159,910 | A | 12/2000 | Shimizu et al. |
| 6,586,087 | B2 | 7/2003 | Young |
| 6,658,861 | B1 | 12/2003 | Ghoshal et al. |
| 6,665,186 | B1 | 12/2003 | Calmidi et al. |
| 6,708,501 | B1 | 3/2004 | Ghoshal et al. |
| 6,918,984 | B2 | 7/2005 | Murray et al. |
| 7,131,286 | B2 | 11/2006 | Ghoshal et al. |
| 7,176,564 | B2 | 2/2007 | Kim |
| 7,293,416 | B2 | 11/2007 | Ghoshal |
| 7,296,417 | B2 | 11/2007 | Ghoshal |
| 7,340,904 | B2 | 3/2008 | Sauciuc et al. |
| 7,342,787 | B1 | 3/2008 | Bhatia |
| 7,348,665 | B2 | 3/2008 | Sauciuc et al. |
| 2002/0170173 | A1 | 11/2002 | Mashino |
| 2002/0189495 | A1 | 12/2002 | Hayashi et al. |
| 2002/0189894 | A1 | 12/2002 | Davis et al. |
| 2003/0080341 | A1 | 5/2003 | Sakano et al. |
| 2003/0228424 | A1 | 12/2003 | Dove et al. |
| 2005/0099775 | A1 | 5/2005 | Pokharna et al. |
| 2006/0045755 | A1* | 3/2006 | McDonald et al. ............. 417/50 |
| 2006/0158849 | A1* | 7/2006 | Martin et al. ................ 361/699 |
| 2006/0250731 | A1* | 11/2006 | Parkhurst et al. .............. 361/56 |
| 2008/0050512 | A1 | 2/2008 | Lower et al. |

OTHER PUBLICATIONS

U.S. Appl. No. 12/283,504, filed Sep. 12, 2008, Lower et al.
U.S. Appl. No. 12/283,502, filed Sep. 12, 2008, Wilcoxon et al.
U.S. Appl. No. 12/283,501, filed Sep. 12, 2008, Wilcoxon et al.
U.S. Appl. No. 12/116,126, filed May 6, 2008, Lower et al.
U.S. Appl. No. 11/959,225, filed Dec. 18, 2007, Lower et al.
U.S. Appl. No. 11/784,158, filed Apr. 5, 2007, Lower et al.
U.S. Appl. No. 11/732,982, filed Apr. 5, 2007, Boone et al.
U.S. Appl. No. 11/732,981, filed Apr. 5, 2007, Wilcoxon et al.
U.S. Appl. No. 11/508,782, filed Aug. 23, 2006, Lower et al.
Bonding and Coating Applications of PQ® Soluble Silicates, Bulletin 12-31, PQ Corporation, 2003, 7 pages.
PQ® Soluble Silicates in Refractory and Chemical-Resistant Cements, Bulletin 24-1, PQ Corporation, 2003, 6 pages.
Click et al., SCHOTT Low Temperature Bonding for Precision Optics, 20 pages.
Technical Standard Order, TSO-C115b, Airborne Area Navigation Equipment Using Multi-Sensor Inputs, Sep. 30, 1994, 11 pages, Department of Transportation, Federal Aviation Administration, Washington, DC.
Techpowerup, NanoCoolers puts liquid metal in your PC, May 4, 2005, 19 pages.
Thresh, The Action of Natural Waters on Lead, The Analyst, Proceedings of the Society of Public Analysts and Other Analytical Chemists, Nov. 1922, pp. 459-468, vol. XLVII, No. 560.
International Search Report and Written Opinion for Application No. PCT/US2009/036355, mail date Jun. 30, 2009, 11 pages.
Office Action for U.S. Appl. No. 12/116,126, mail date Nov. 20, 2009, 7 pages.
Non-Final Office Action for U.S. Appl. No. 11/784,932, dated Apr. 3, 2009, 8 pages.
Non-Final Office Action for U.S. Appl. No. 11/784,158, dated Apr. 21, 2009, 10 pages.
Final Office Action for U.S. Appl. No. 11/508,782, dated Jun. 16, 2009, 13 pages.

\* cited by examiner

SYSTEM AND METHOD FOR PROPORTIONAL COOLING WITH LIQUID METAL

CROSS-REFERENCE TO RELATED APPLICATIONS

The present application constitutes a continuation-in-part of United States patent application having the U.S. patent application Ser. No. 12/116,126, entitled SYSTEM AND METHOD FOR A SUBSTRATE WITH INTERNAL PUMPED LIQUID METAL FOR THERMAL SPREADING AND COOLING, naming Nathan P. Lower, Ross K. Wilcoxon, Qizhou Yao, David W. Dlouhy and John A. Chihak as inventors, filed May 6, 2008, which may be currently co-pending, or may be an application of which a currently co-pending application may be entitled to the benefit of the filing date.

All subject matter of the Related Applications and of any and all parent, grandparent, great-grandparent, etc. applications of the Related Applications may be incorporated herein by reference to the extent such subject matter may be not inconsistent herewith.

BACKGROUND

The present application relates generally to the field of cooling electronics. More specifically, the application relates to cooling of power dissipating devices, such as electronics, using liquid metal.

There may be a growing demand to make electronic devices smaller and to operate at higher power. In some applications, including computers, peak power densities may be reaching 400-500 W/cm$^2$ and climbing. As a result, it may be becoming increasingly more difficult to thermally manage these devices. Increasing temperatures often lead to decreased efficiency and reliability.

Conventional thermal management techniques such as forced air cooling, liquid cooling, spray cooling, and thermoelectric cooling may adequately cool the electronic device in some cases, but these techniques may be complicated, unreliable, orientation sensitive, or unsuitable for volume-constrained systems. The use of passive heat spreading materials and heat pipes may also adequately cool the electronic device, but increasing thermal path length, orientation effects and high device power may render these techniques insufficient. Conventional techniques may no longer provide adequate cooling for advanced high power electronic systems.

Thus there may be a need for a low cost cooling system for power dissipating systems, such as high power electronic systems. Further, there may be a need for a simple and reliable cooling system that does not add significant cost and power requirements. Further still, there may be a need for an integrated thermal management technique for spreading heat from a circuit board. Yet further, there may be a need for a thermal management system for portable applications, including military applications, which may be smaller in size and weight.

SUMMARY

One embodiment of the application relates to a circuit board including a device to be cooled and a channel. The liquid metal may be pumped through the channel by an electromagnetic pump mechanism associated with the device to be cooled.

Another embodiment of the application relates to a circuit board including an electromagnetic pumping mechanism including one or more electrodes, one or more magnets, and a channel. The channel may include a liquid metal and a coating. The liquid metal may be pumped through the channel by an electromagnetic force generated by the one or more electrodes and one or more magnets.

Another embodiment of the application relates to a circuit board including channel means for containing a liquid metal, and pump means for pumping the liquid metal through the channel means.

BRIEF DESCRIPTION OF THE DRAWINGS

The disclosure will become more fully understood from the following detailed description, taken in conjunction with the accompanying drawings, wherein like reference numerals refer to like elements, in which.

DETAILED DESCRIPTION

Figure 1:
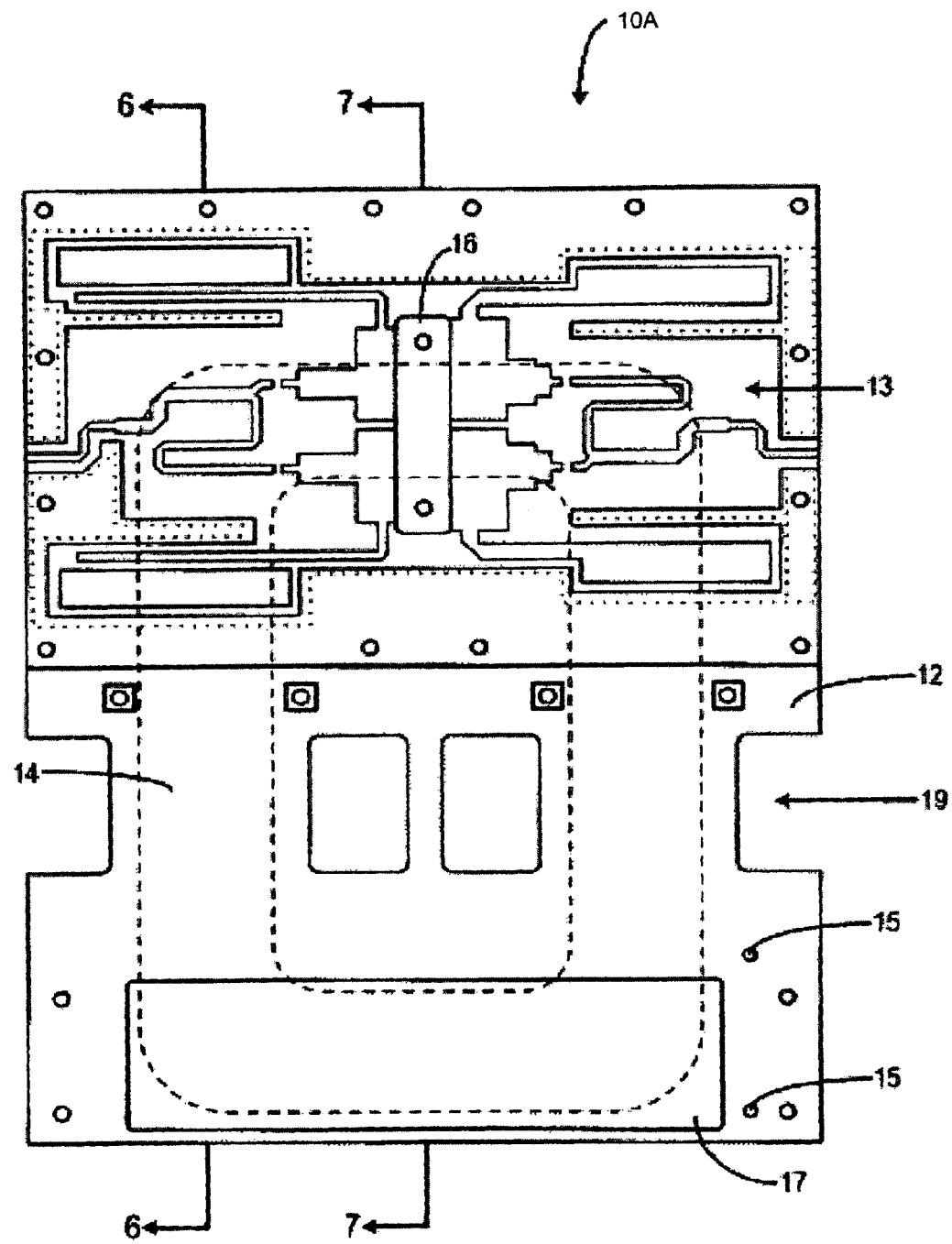
FIG. 1 illustrates an overhead schematic view of a circuit board with an integrated thermal management system.

Before describing in detail the particular improved system and method, it should be observed that the invention may include, but may be not limited to a novel structural combination of conventional data/signal processing components and communications circuits, and not in the particular detailed configurations thereof. Accordingly, the structure, methods, functions, control and arrangement of conventional components software, and circuits have, for the most part, been illustrated in the drawings by readily understandable block representations and schematic diagrams, in order not to obscure the disclosure with structural details which will be readily apparent to those skilled in the art, having the benefit of the description herein. Further, the invention may be not limited to the particular embodiments depicted in the exemplary diagrams, but should be construed in accordance with the language in the claims.

Figure 2:
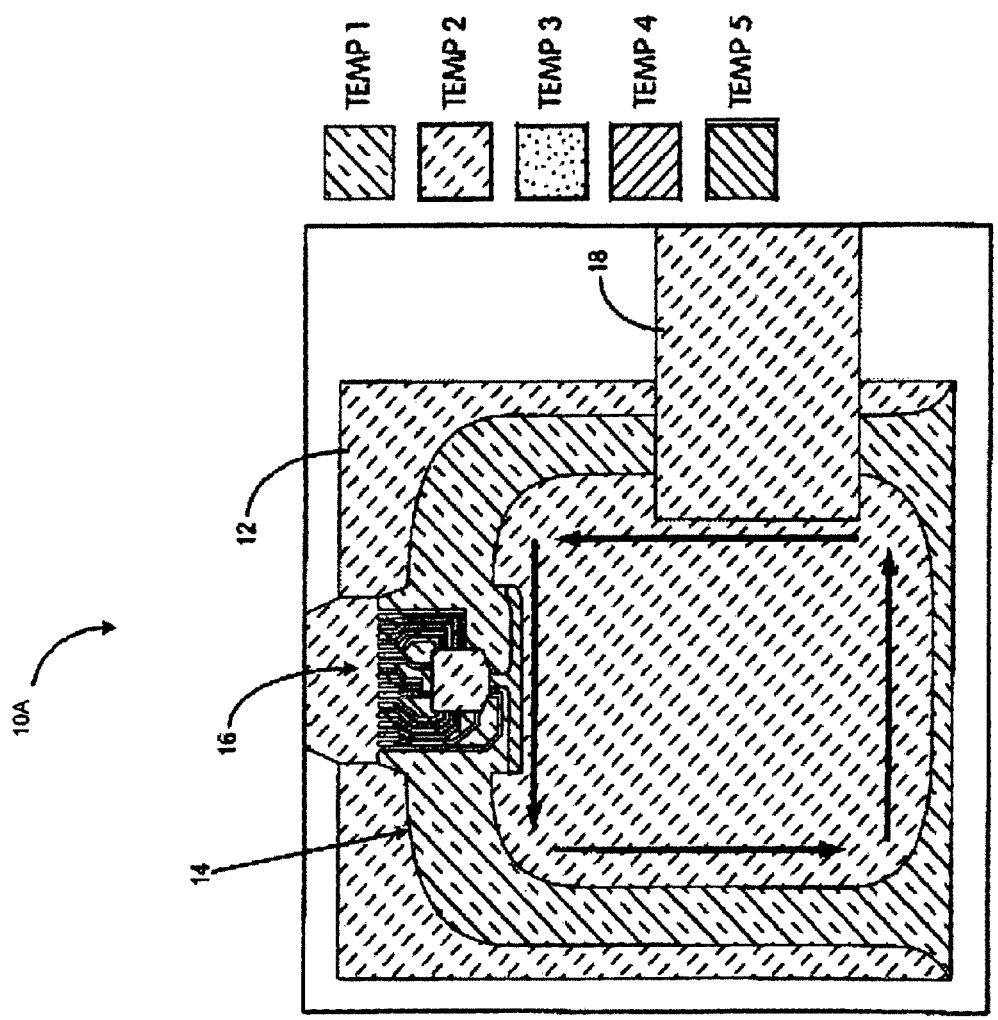
FIG. 2 illustrates a thermal imaging schematic view of a thermal management system similar to that of FIG. 1.

Referring to FIGS. 1 and 2, according to an exemplary embodiment, a thermal management system 10A may provide significant improvement in the thermal spreading capability of a substrate 12 including circuitry 13 as compared to passive materials and composites. The thermal management system 10A may include a closed-loop liquid metal channel 14 in substrate 12 containing a device 16 to be cooled by liquid metal 20 flowing in the liquid metal channel 14. According to various exemplary embodiments, the substrate 12 may be a printed circuit board, a thermal spreader (which may be rigid or mechanically flexible), or any other substrate to which at least one power dissipating device, such as an electronic component, may be attached or interfaced. According to various exemplary embodiments, the device 16 may be a high power electronic circuit (e.g., a rectifier, an inverter, another power semiconductor device, etc.), a microprocessor, and/or any other analog or digital circuit that generates heat.

The liquid metal 20 may be circulated through liquid metal channel 14 using a magnetic or electromagnetic (EM) pump 18. The pump 18 may be inserted into or attached to the substrate at a feed-through or cavity 19. As the liquid metal 20 flows, it may draw heat away from device 16 and spread the heat throughout substrate 12 and/or carry the heat to a heat sink 17 that may be in contact with a heat rejection area on the circuit board. By transferring heat away from device 16, the thermal transfer may be significantly improved over conventional passive thermal spreading materials, including copper. Because the liquid metal cooling may be single phase (no phase change occurs), thermal management system 10A may not be restrained by the heat flux limits of two phase systems such as heat pipes. While the liquid metal 20 is shown by arrows to flow in a particular direction, according to other exemplary embodiments, the thermal management system could be configured for the liquid metal to flow in the other direction. The liquid metal channel 14 may be filled with liquid metal 20 using ports 15. The heat sink 17 may be a copper plate, another metal plate, may include cooling fins, or may be any other device capable promoting heat exchange. The circuitry 13 may be high or low power electronic circuits and may also be cooled using liquid metal channel 14.

Referring specifically to FIG. 2, as an example, the liquid metal 20 generally flows through liquid metal channel 14 at a first or lowest temperature (e.g., between 15 and 25 degrees Celsius (C), between 18 and 22 degrees C., between 20 and 21 degrees C., at about 20 or 21 degrees C., etc.) in thermal management system 10A. A substantial portion of substrate 12 and at least a portion of device 16 may be at a second temperature that may be higher than the first temperature (e.g., between 20 and 24 degrees C., between 21 and 23 degrees C., at about 22 degrees C., below 20 degrees C., etc.). A portion of device 16 may be at a third temperature that may be higher than the second temperature (e.g., between 22 and 26 degrees C., between 23 and 25 degrees C., at about 24 degrees C., etc.). A portion of device 16 may be at a fourth temperature that may be higher than the third temperature (e.g., between 23 and 27 degrees C., between 24 and 26 degrees C., at about 25 degrees C., etc.). A portion of device 16 may be at a fifth temperature that may be higher than the fourth temperature (e.g., between 25 and 30 degrees C., between 26 and 29 degrees C., at about 28 degrees C., above 30 degrees C., etc.). It may be noted that while FIG. 2 illustrates a single heat dissipating device 16, according to other exemplary embodiments, the substrate 12 may absorb dissipated heat from more than one component.

According to various exemplary embodiments, the liquid metal 20 may be an alloy, such as a Gallium-Indium-Tin alloy. According to other exemplary embodiments, alternative liquid metal 20 may be used, including alloys containing any combination of the following: gallium, indium, tin, bismuth, lead, sodium, and potassium. According to some exemplary embodiments, the Gallium-Indium-Tin alloy may be a eutectic composition (e.g. the lowest melting point within the compositional series) with a low boiling point. According to some exemplary embodiments, the Gallium-Indium-Tin alloy may be Galinstan®. Galinstan® may be a generally non-flammable, non-toxic, environmentally friendly liquid metal that may be often used as a mercury replacement in medical equipment. Galinstan® may be generally stable from −19 degrees C. to greater than 1300 degrees C., has approximately thirty times the thermal conductivity of water, and may be insoluble to water and organic solvents. The high boiling point of Galinstan® (greater than 1300 degrees C.) ensures that it will remain in a liquid state under temperatures and pressures likely to be encountered in electronics cooling.

Figure 3:
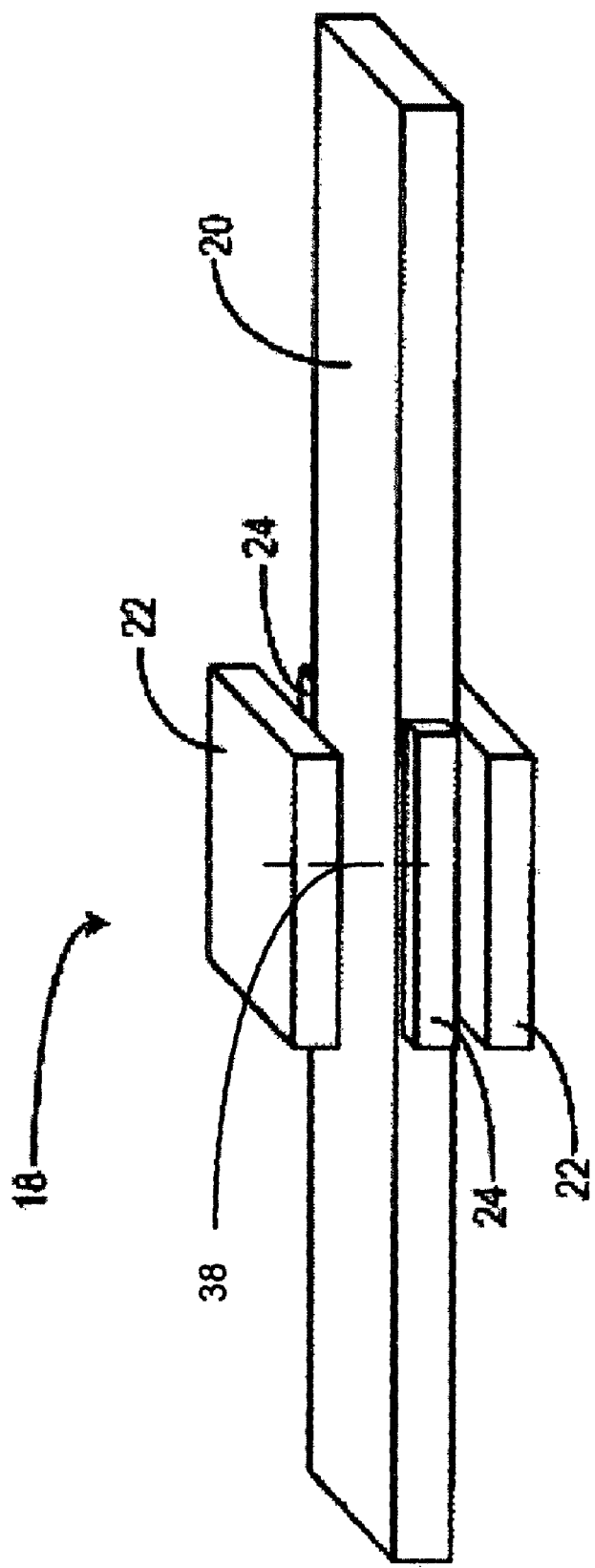
FIG. 3 illustrates a perspective view of an electromagnetic pump for pumping liquid metal in the thermal management system of FIG. 1.

Referring to FIG. 3, pump 18 may be an electromagnetic pump to circulate a liquid metal 20 through thermal management system 10A. The pump 18 may provide quiet or silent operation, high reliability, orientation independence, little to no vibration, low power dissipation, and a controllable flow rate for adjustment of thermal spreading capability. The pump 18 may include a ferrous yoke for containing and directing the magnetic field within the yoke and through the liquid metal channel 14 between north and south poles of magnets 22. A pair of electrodes 24 may transmit a current 38 across liquid metal 20 in a direction perpendicular to the magnetic field generated by magnets 22. The movement of the current 38 across the magnetic field may impart a force on the liquid metal 20 that may be perpendicular to both the magnetic field and the current 38. The amount of force generated follows the following equation:

$$F = I * L x B \quad (1)$$

Where I may be current 38 (in amps), L may be a vector, whose magnitude may be the length of the current path (in meters), x may be the vector cross product, and B may be the magnetic field vector measured in Teslas.

The magnitude of force may be represented by the variable F, the magnitude of the magnetic field may be represented by the variable B, the amount of current may be represented by the variable I, and the electrode spacing may be represented by the variable L. The pressure of the liquid metal 20 flow may be calculated with the following equation:

$$P = \frac{F}{L \times h} \quad (2)$$

The pressure may be represented by the variable P, the force by the variable F, the spacing of electrodes 24 by the variable L, and the height of liquid metal channel 14 by the variable h.

The pump 18 may be made to occupy a small volume (e.g., approximately one cubic centimeter, less than one cubic centimeter, less than 10 cubic centimeters, greater than 1 cubic centimeter, etc.) and may pump liquid metal 20 with electrical power of less than 10 mW, less than 100 mW, less than 500 mW, etc. The pump 18 includes no moving parts, may require little to no maintenance, may be orientation independent, and may be generally stable at air pressures down to $10^{-8}$ Torr at 500 degrees Celsius. According to various exemplary embodiments, one or both of magnets 22 may be permanent magnets and/or electromagnets including coils to induce a magnetic field. While two electrodes 24 are shown, according to other exemplary embodiments, the current may be generated by a single electrode and a ground, or more than two electrodes. While two magnets 22 are shown, according to other exemplary embodiments a single magnet with a pole extending over opposite sides of liquid metal channel 14, or more than two magnets could be used. According to various exemplary embodiments, pump 18 may operate at less than about 1 W, between about 100 mW and about 500 mW, less than 500 mw, less than 100 mw, etc. The pump 18 may be coupled to a processor, a user interface, or other digital or analog circuitry to control electric current flow and thereby adjust the pump flow.

A coating may be applied to the inner and/or outer perimeter of the liquid metal channel 14 to provide a passivation within the liquid metal channel 14. According to some exemplary embodiments, the coating may reduce alloying, diffusion, or chemical reaction between components in the channel (e.g., metallic components) and the alloy. The coating may provide at least a substantially hermetic seal around the liquid metal 20 to separate it from the substrate 12 itself and/or the substrate circuitry 13. According to various exemplary embodiments, the coating may be a thermally conductive coating capable of minimizing the thermal resistance between the liquid metal 20 and the substrate 12 or circuitry 13. The coating may be composed of any material or materials capable of passivating the liquid metal 20 from the substrate 12 or circuitry 13, capable of promoting thermal conductivity between the liquid metal 20 and the substrate 12 or circuitry 13, and/or capable of being applied to the liquid metal channel 14 of the substrate 12. According to some exemplary embodiments, the coating may only be applied to metallic portions of the liquid metal channel 14 that may be in contact with the liquid metal 20.

According to other exemplary embodiments, the coating may be a coating described in U.S. patent application Ser. No. 11/508,782 filed on Aug. 23, 2006 and entitled "Integrated Circuit Protection and Ruggedization Coatings and Methods," U.S. patent application Ser. No. 11/784,158 filed on Apr. 5, 2007 and entitled "Hermetic Seal and Hermetic Connector Reinforcement and Repair with Low temperature Glass Coatings," U.S. patent application Ser. No. 11/732,982 filed on Apr. 5, 2007 and entitled "A Method for Providing Near-Hermetically Coated Integrated Circuit Assemblies," U.S. patent application Ser. No. 11/732,981 filed on Apr. 5, 2007 and entitled "A Method for Providing Near-Hermetically Coated, Thermally Protected Integrated Circuit Assemblies," U.S. patent application Ser. No. 11/784,932 filed on Apr. 10, 2007 and entitled "Integrated Circuit Tampering Protection and Reverse Engineering Prevention Coatings and Methods," and/or U.S. patent application Ser. No. 11/959,225 filed on Dec. 18, 2007 and entitled "Adhesive Applications Using Alkali Silicate Glass for Electronics," each of which may be herein incorporated by reference in its entirety.

Where an electrically conductive contact to the liquid metal 20 may be required, such as at the electrodes 24 within the pump 18, an electrically conductive coating may be used, which consists of nickel, tantalum, or tungsten metal. Similarly, solid Nickel, Tungsten, or Tantalum wires may be used for the electrodes.

Figure 4:
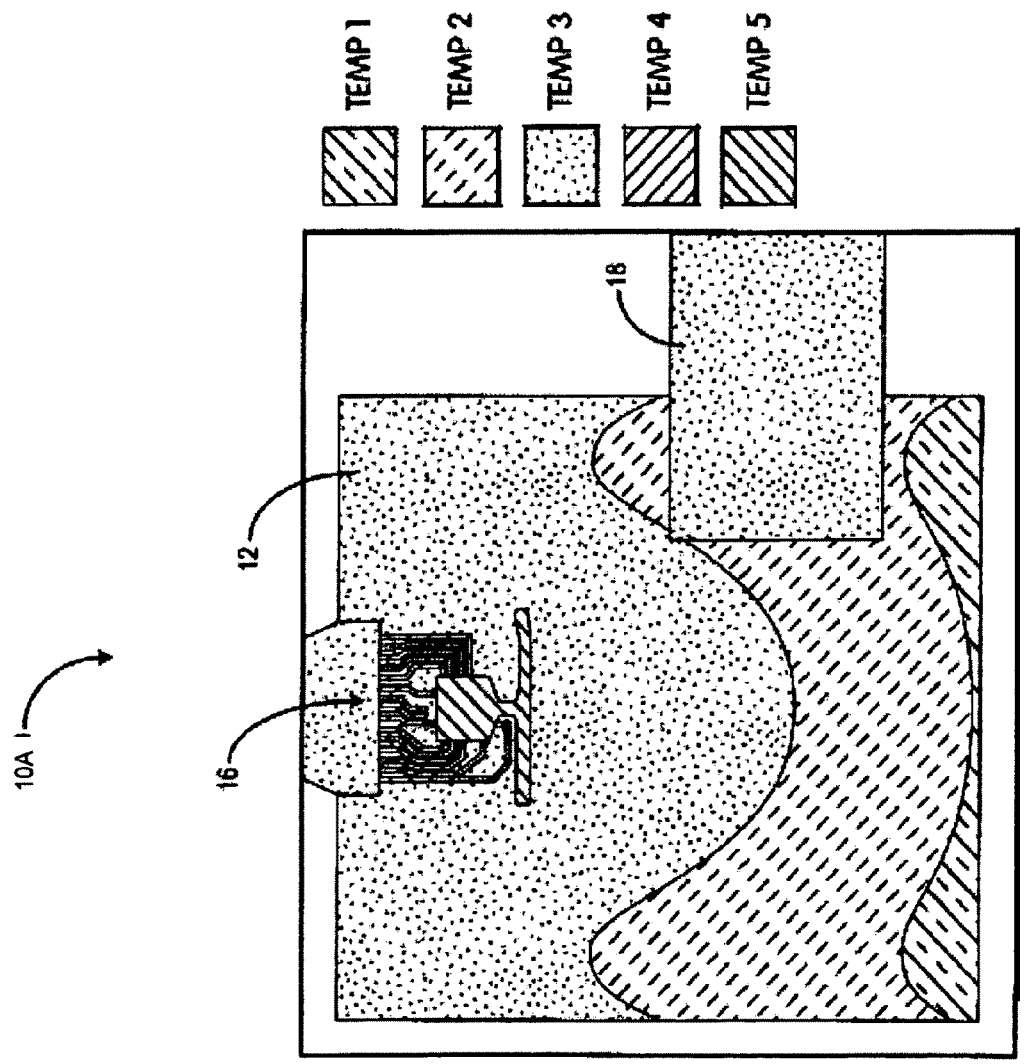
FIG. 4 illustrates a thermal imaging schematic view of thermal management system of FIG. 1.

Referring to FIG. 4, the temperature of substrate 12 and device 16 may be significantly higher (e.g. Temps 4 and 5) when pump 18 is turned off in thermal management system 10A. Only the small portion of substrate 12 may be at the first or lowest temperature (e.g. Temp 1) with a larger portion of substrate 12 at the second temperature (e.g. Temp 2) and a substantial portion of substrate 12 at the third temperature (e.g. Temp 3). The device 16 may operates at elevated temperatures (e.g. Temps 4 and 5) when substrate 12 is not pumping liquid metal. Such a condition may affect performance and/or reliability.

Figure 5:
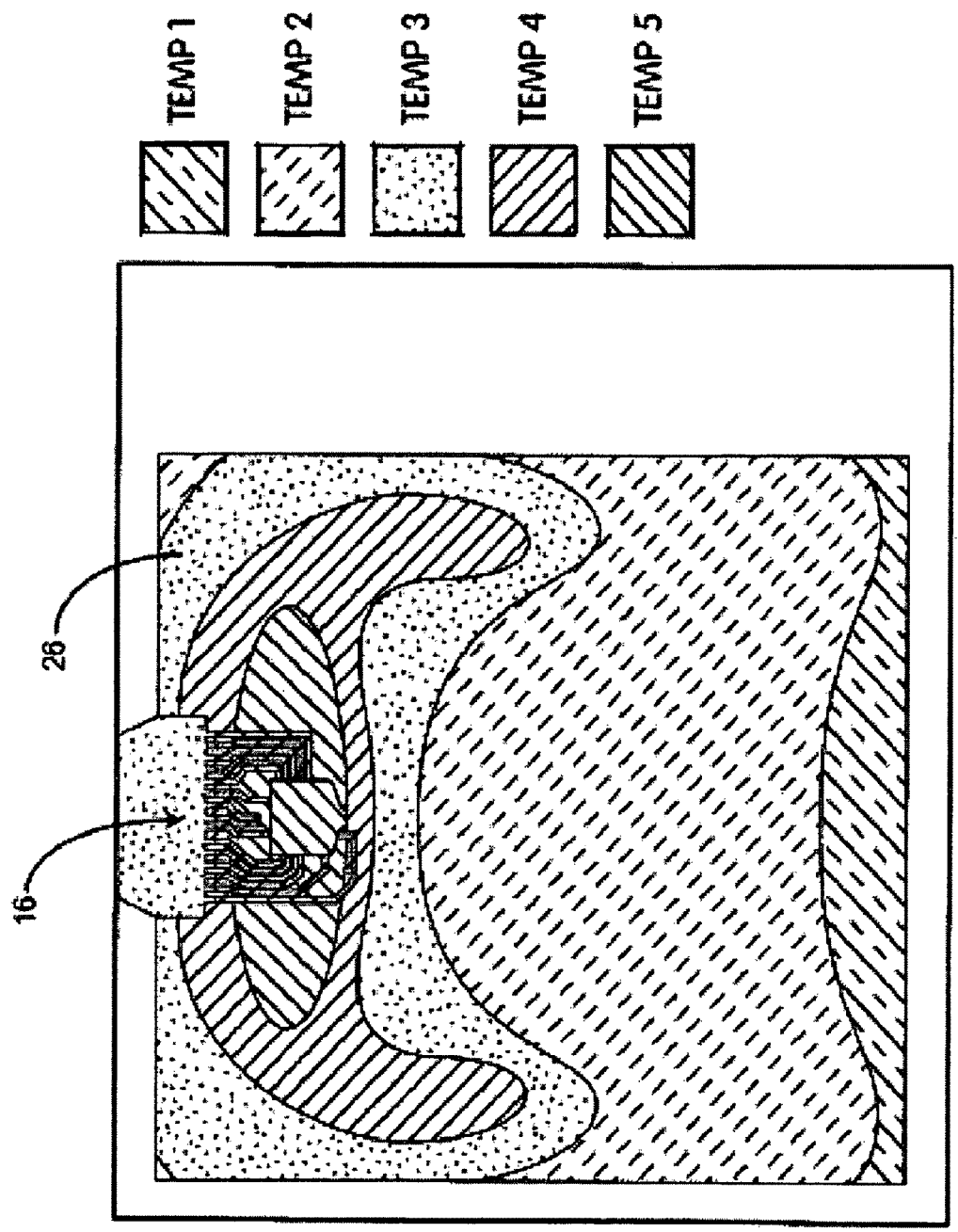
FIG. 5 illustrates a thermal imaging schematic view of a thermal management system including a copper insert.

Referring to FIG. 5, according to one exemplary embodiment, the temperature of device 16 may be greatly reduced with the sealed liquid metal channel 14 in thermal management system 10A as compared to a copper heat sink 26 of the same dimension (as shown in FIG. 5). The temperature of device 16 may rise about eighty degrees C. over the copper heat sink 26 temperature but may rise only about 18.5 degrees Celsius over the cold plate temperature on the substrate 12 of FIG. 1. In the substrate 12, device 16 may contribute to the majority of the thermal gradient. The temperature difference across liquid metal channel 14 may be about 1.6 degrees C. as compared to about seventy degrees C. on copper heat sink 26. This difference represents a nearly forty-four times improvement in effective thermal conductivity over a copper heat sink 26. With smaller liquid metal channel 14 dimensions and/or longer liquid metal channel 14 length, the thermal conductivity may be greater.

Figure 6:
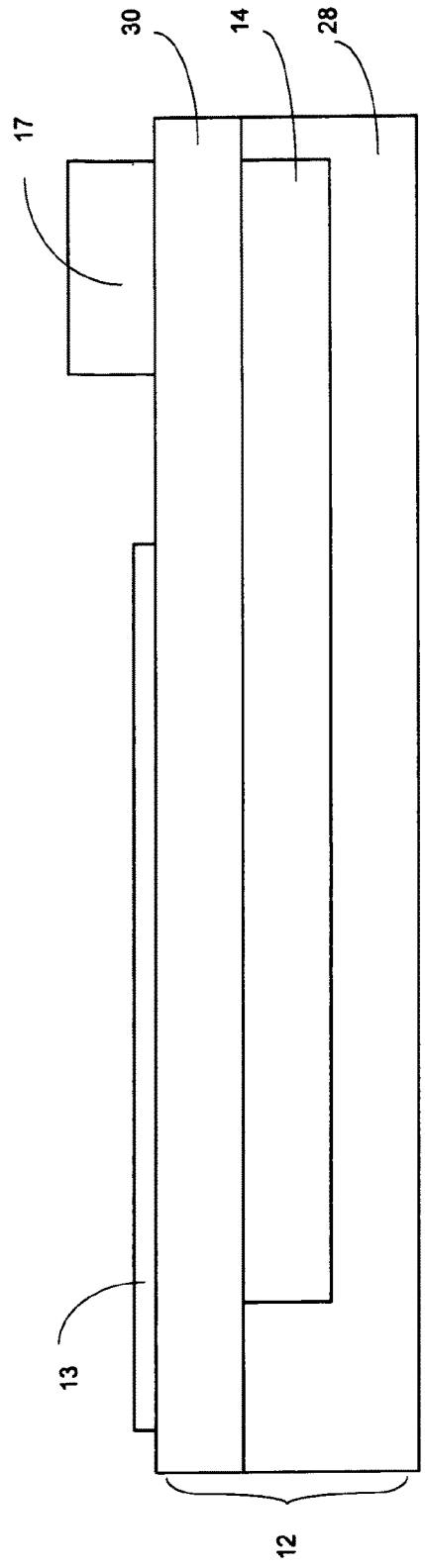
FIG. 6 illustrates a side cross section view through a portion of the thermal management system of FIG. 1.
Figure 7:
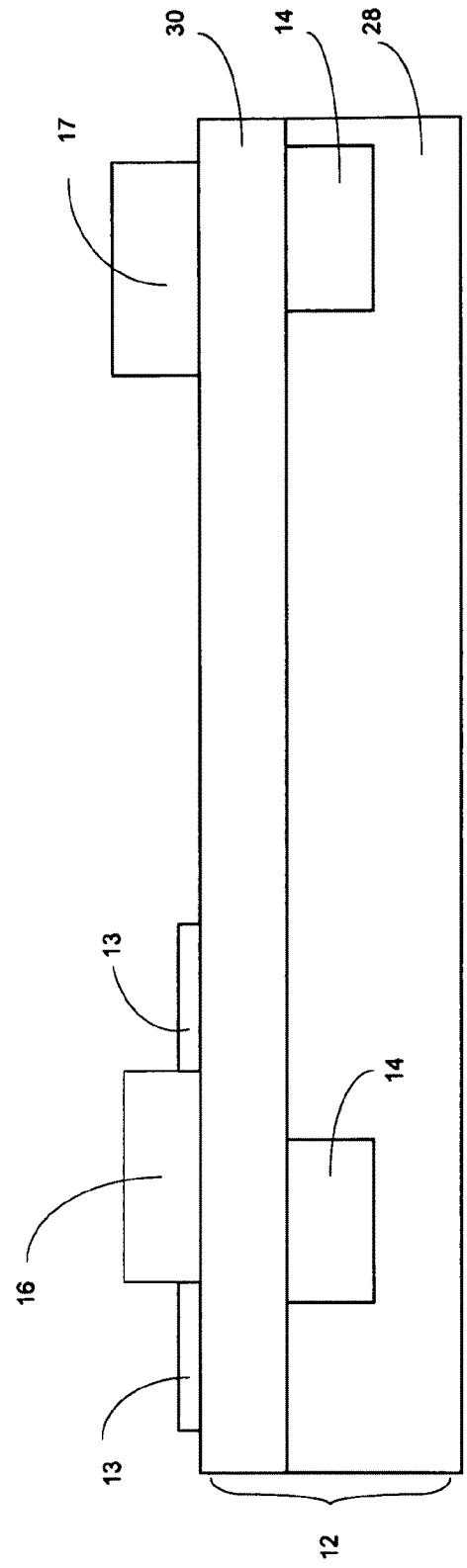
FIG. 7 illustrates side cross section view through another portion of the thermal management system of FIG. 1.

Referring to FIGS. 6 and 7, a cross-sectional view of the thermal management system 10A of FIG. 1 is presented. The thermal management system 10A may include multiple layers. The thermal management system 10A may include a substrate 12 which may include a base layer 28 that defines liquid metal channel 14 and a top layer 30 that covers liquid metal channel 14. The circuitry 13, device 16, and heat sink 17 may be attached to top layer 30.

According to various exemplary embodiments, the liquid metal channel 14 may be formed by etching substrate 12 (e.g., wet etching, plasma etching, silk screen printing, photoengraving, PCB milling, die cutting, stamping, etc.) during fabrication. The substrate 12 may include any material used to make circuit boards or heat sinks including copper, any conductive material, or any non-conductive material. In one example, substrate 12 may include thermally conductive inserts or other devices for increased heat dissipation.

For example, the etching may etch away a base layer 28 of copper (or other layer) on top of a non-conductive layer to form the liquid metal channel 14. Alternatively, the etching may etch away a base layer 28 of non-conductive material (or both a layer of copper and a non-conductive layer) to form liquid metal channel 14. The liquid metal channel 14 may then be coated and/or sealed with a thermally conductive coating. Thereafter, another conductive (e.g., a heat sink 17) or non-conductive layer (e.g., top layer 30) may be placed on top of the etched base layer 28. Alternatively, the etched base layer 28 may be placed on top of another layer or between two other layers. The non-etched layers may also include a coating to facilitate greater thermal conductivity and/or sealing with thermal management system 10A. The coating may be applied to liquid metal channel 14, base layer 28 and/or top layer 30 during etching or after etching and before assembly. The coating may also be applied after partial assembly (e.g., after an etched layer is placed on a base layer) and before any additional layers are added.

According to various exemplary embodiments, the width of liquid metal channel 14 may be between 5 and 50 mm. According to various exemplary embodiments, the height of liquid metal channel 14 may be as small as 10 microns and as large 2000 microns. According to various exemplary embodiments, the length of liquid metal channel 14 may be between typically 5 and 200 cm. The values of these dimensions, especially the maximum values, may be primarily dictated by geometric requirements of the system that may be being thermally managed with the liquid metal channel 14 rather than limitations of the liquid metal cooling approach itself.

According to various exemplary embodiments, the general cross-sectional shape of liquid metal channel 14 may be square, rectangular, triangular, hexagonal, trapezoidal, or any other shape. While liquid metal channel 14 is shown to have a specific rectangular-shaped flow path, according to other exemplary embodiments, the path may be of any shape or direction that facilitates the cooling of device 16.

According to some exemplary embodiments, the liquid metal 20 may be added to liquid metal channel 14 during fabrication before a coating seals liquid metal channel 14 or before a top layer 30 is placed on top of an etched base layer 28. According to other exemplary embodiments, a reservoir may feed liquid metal 20 to liquid metal channel 14. The reservoir may be etched or otherwise formed into substrate 12. Alternatively, the reservoir may be external to substrate 12 (e.g., attached to substrate 12) and coupled to liquid metal channel 14. The substrate 12 may include a heat sink 17 and/or fan at or near an end of substrate 12 opposite from a heat source (e.g. a device 16) to help cool the liquid metal 20 flowing from device 16. Alternatively or additionally, an external reservoir may include a heat sink 17 and/or fan at or near an end of substrate 12 opposite from the heat source (e.g. a device 16) to help cool the liquid metal 20 flowing from device 16.

Figure 8:
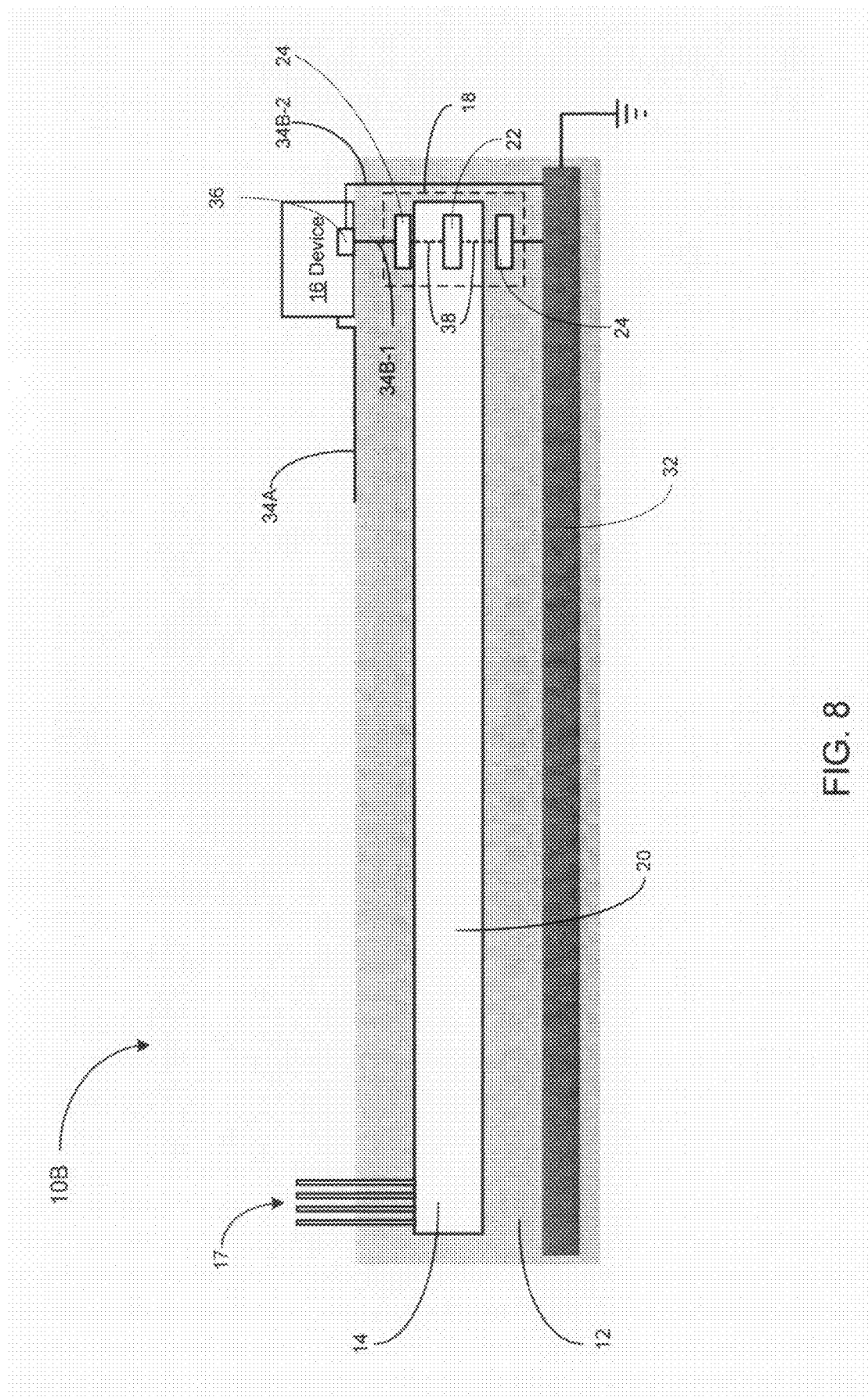
FIG. 8 illustrates a side view of a circuit board with an integrated thermal management system.
Figure 9:
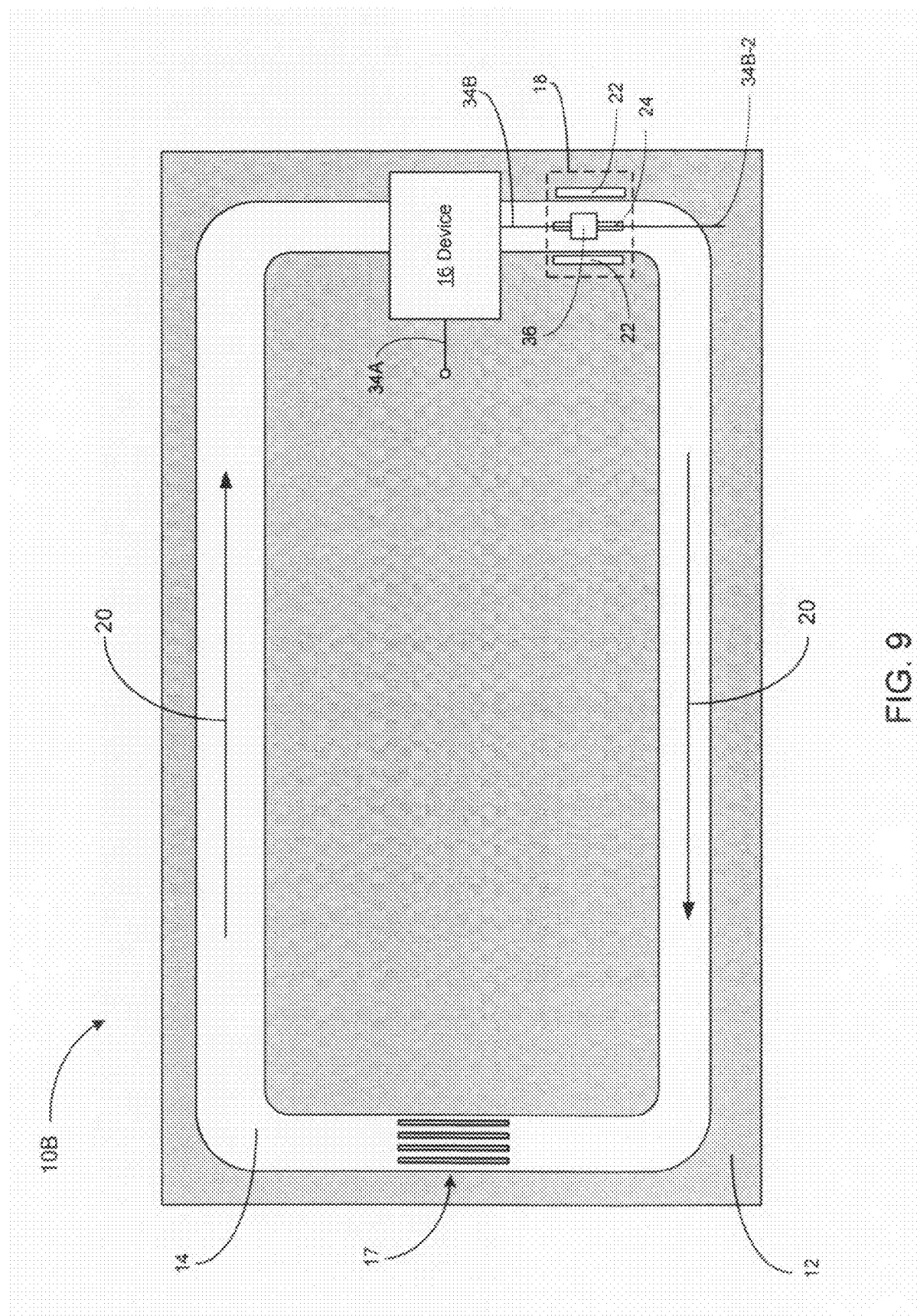
FIG. 9 illustrates an overhead view of a circuit board with an integrated thermal management system.

Referring to FIGS. 8 and 9, a thermal management system 10B is illustrated. Similar to thermal management system 10A, thermal management system 10B may include a closed-loop liquid metal channel 14 in substrate 12 containing a device 16 to be cooled by liquid metal 20 flowing in the liquid metal channel 14. According to various exemplary embodiments, the substrate 12 may be a printed circuit board, a thermal spreader (which may be rigid or mechanically flexible), or any other substrate to which at least one power dissipating device, such as an electronic component, may be attached or interfaced. According to various exemplary embodiments, the device 16 may be a high power electronic circuit (e.g., a rectifier, an inverter, another power semiconductor device, etc.), a microprocessor, and/or any other analog or digital circuit that generates heat.

The liquid metal 20 may be circulated through liquid metal channel 14 using a magnetic or electromagnetic (EM) pumping mechanism 18. As the liquid metal 20 flows, it may draw heat away from device 16 and spread the heat throughout substrate 12 and/or carry the heat to a heat sink 17 that may be in contact with a heat rejection area on the circuit board. By transferring heat away from the device 16, the thermal transfer may be significantly improved over conventional passive thermal spreading materials, including copper. Because the liquid metal cooling may be single phase (no phase change occurs), thermal management system 10A may not be restrained by the heat flux limits of two phase systems such as heat pipes. While the liquid metal 20 is shown by arrows to flow in a particular direction, according to other exemplary embodiments, the thermal management system could be configured for the liquid metal to flow in the other direction. The heat sink 17 may be a copper plate, another metal plate, may include cooling fins, or may be any other device capable promoting heat exchange. The circuitry 13 may be high or low power electronic circuits and may also be cooled using liquid metal channel 14.

In contrast to thermal management system 10A, thermal management system 10B may not include a separate power source for the electromagnetic pump 18. Instead, the current for powering the electromagnetic pump 18 may be obtained from the power circuitry associated directly with the device 16.

For example, as shown in FIGS. 8 and 9, the device 16 may be operably coupled to current transmission circuitry 34 (e.g. device circuitry 34A and/or device circuitry 34B. The current transmission circuitry 34 may be operably coupled to the pump 18. FIGS. 8 and 9 illustrate the pump 18 operably coupled to the device circuitry 34B of device 16. However, the pump 18 may be operably coupled to the device circuitry 34A of device 16 without departing from the scope of the invention.

In such configurations, the current flowing into or out of the device 16 may provide an electromagnetic force for pumping the liquid metal 20. As the heat generated by a device 16 is generally proportional to the current provided to the device 16, such a configuration may serve to automatically control the pumping velocity of liquid metal 20 according to the current provided to the device.

The pump 18 may include a ferrous yoke for containing and directing the magnetic field within the yoke and through the liquid metal channel 14 between north and south poles of magnets 22. A pair of electrodes 24 may transmit a current 38 across liquid metal 20 in a direction perpendicular to the magnetic field generated by magnets 22. The movement of the current 38 across the magnetic field may impart a force on the liquid metal 20 that may be perpendicular to both the magnetic field and the current 38.

According to various exemplary embodiments, one or both of magnets 22 may be permanent magnets and/or electromagnets including coils to induce a magnetic field. While two electrodes 24 are shown, according to other exemplary embodiments, the current may be generated by a single electrode and a ground, or more than two electrodes. While two magnets 22 are shown, according to other exemplary embodiments a single magnet with a pole extending over opposite sides of liquid metal channel 14, or more than two magnets could be used. According to various exemplary embodiments, pump 18 may operate at less than about 1 W, between about 100 mW and about 500 mW, less than 500 mw, less than 100 mw, etc. The pump 18 may be coupled to a processor, a user interface, or other digital or analog circuitry to control electric current flow and thereby adjust the pump flow.

It will be recognized one knowledgeable in the art that pump 18 may be disposed in either an upstream or downstream position in relation to the device 16 with respect to the current flow relative to the device 16 without departing from the scope of the present disclosures.

In instances where the current provided to the device 16 exceeds the current needed to provide adequate pumping action of liquid metal 20, a current shunt 36 element may be provided to reduce the current 38 applied across the liquid metal channel 14. For example, the current shunt 36 may be operably coupled to one of the electrodes 24 via electrode circuitry 34B-1. The current shunt 36 may be operably coupled to a ground plane 32 by current shunt circuitry 34B-2. In such a configuration, the amount of current provided to the electrodes 24 may be modified through the transmission characteristics of the current shunt 36 so as to control the pumping velocity range of the pump 18.

The thermal management system 10A and/or the thermal management system 10B may provide a low cost, simple, reliable, and/or integrated method for spreading heat away from high power devices. Integrating such a technology into an electronic substrate may allow direct heat removal from high power integrated circuits (IC) and passive devices while also providing electrical interconnect to these components. While this approach could be used for almost any type of electronics packaging, specific examples of suitable applications include RF Power Amplifiers and Light Emitting Diode (LED) light arrays, which may otherwise require that a heat sink or heat spreader be bonded to the back side of the electronic substrate so that both sides of the circuit card may be populated with electronic components. Another exemplary application may include the use of an electronic substrate with embedded liquid metal cooling channels as part of an antenna array, such as a phased array antenna.

Figure 10:
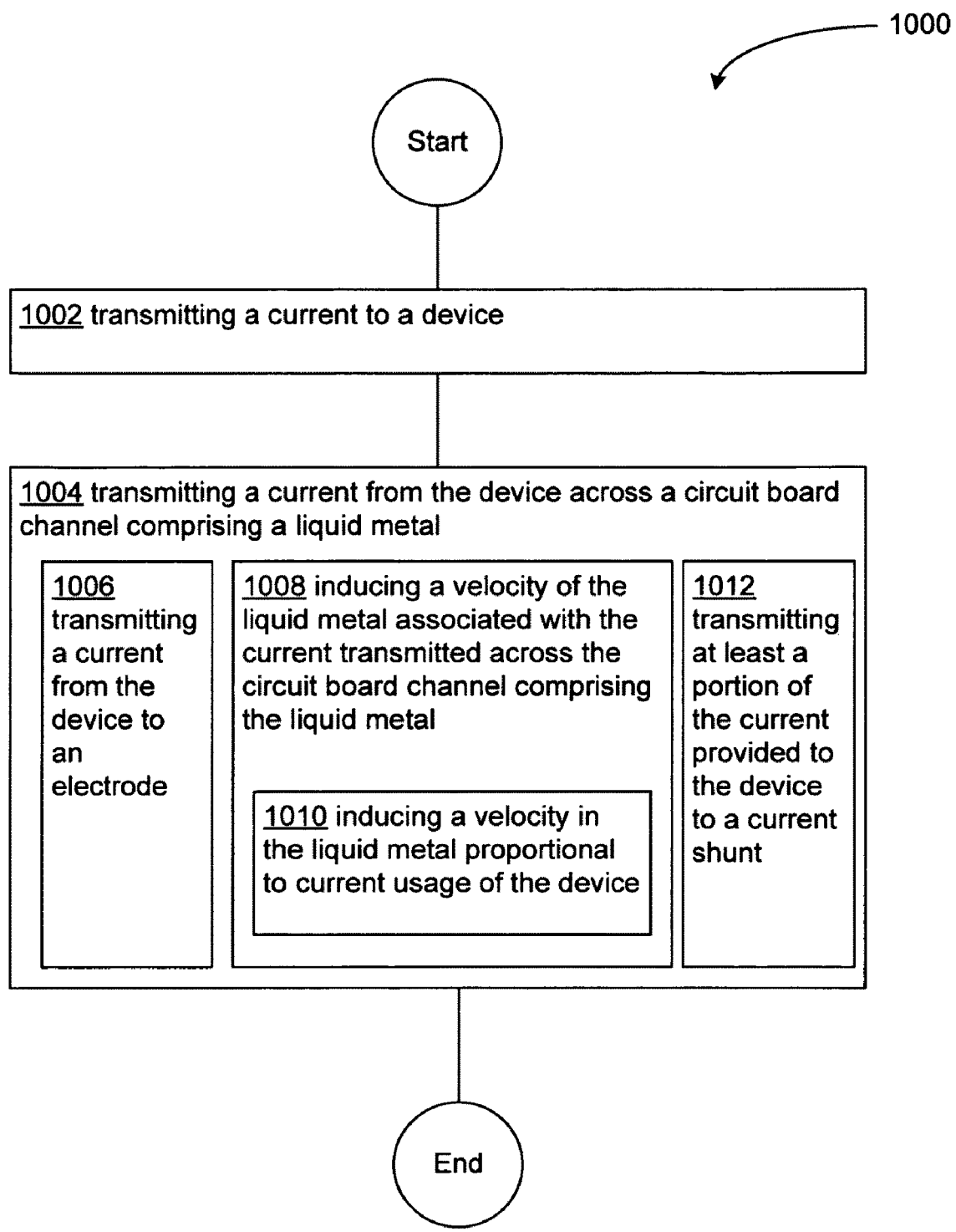
FIG. 10 illustrates a high-level operational flow diagram.
Figure 11:
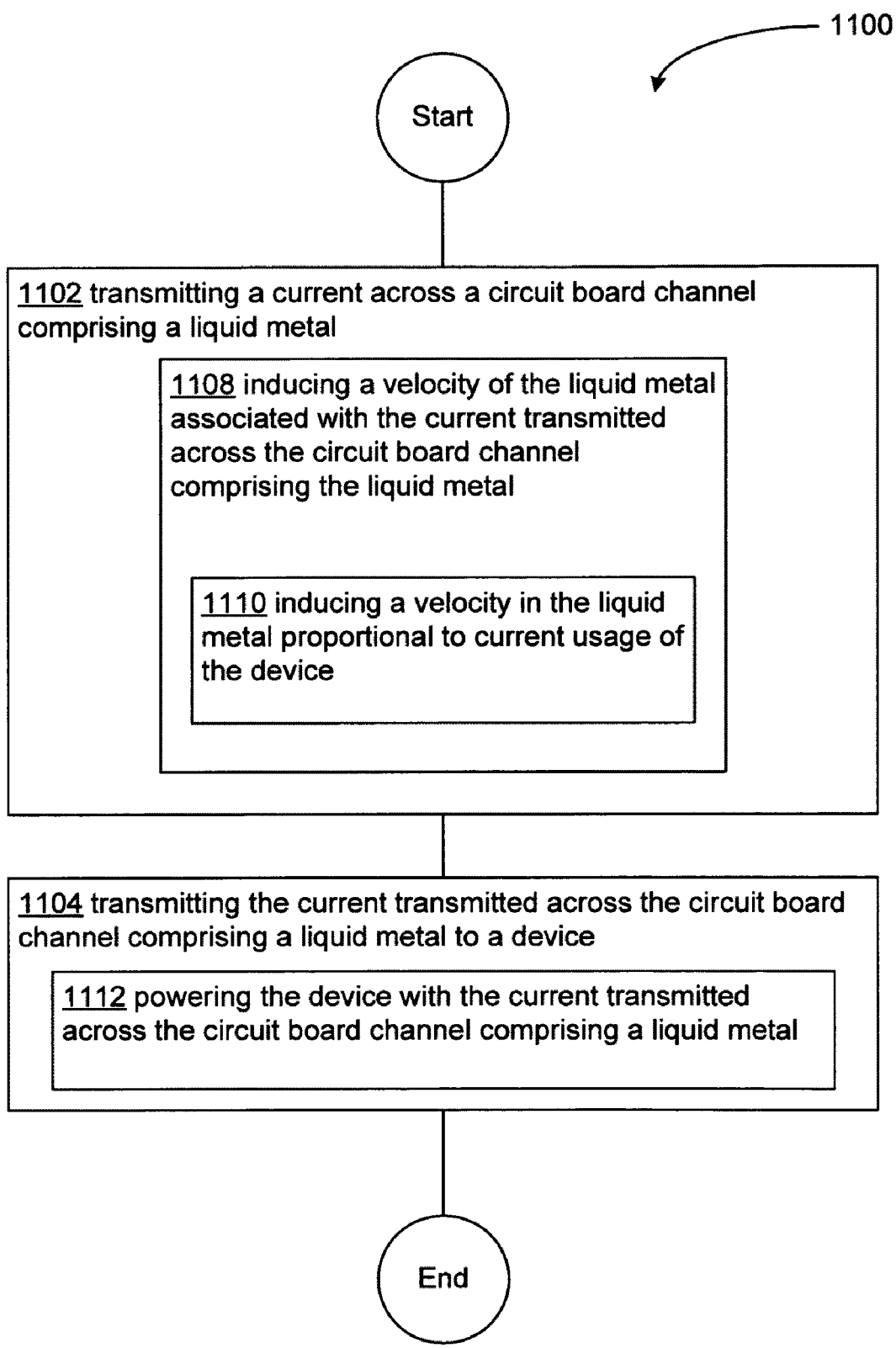
FIG. 11 illustrates a high-level operational flow diagram.

FIGS. 10 and 11 illustrate operational flows representing example operations related to proportional cooling with liquid metal. However, it should be understood that the operational flows may be executed in a number of other environments and contexts, and/or in modified versions of FIG. 1. Also, although the various operational flows are presented in the sequence(s) illustrated, it should be understood that the various operations may be performed in other orders than those which are illustrated, or may be performed concurrently.

Referring to FIG. 10, after a start operation, an exemplary operational flow 1000 moves to a transmitting operation 1002. Operation 1002 illustrates transmitting a current to a device. For example, as shown in FIGS. 8 and 9, a device circuitry 34A may transmit a current from a power source (not shown) to a device 16.

Operation 1004 illustrates, transmitting a current from the device across a circuit board channel comprising a liquid metal. For example, as shown in FIGS. 8 and 9, device circuitry 34B may transmit a current to pump 18 from the device 16. The pump 18 may transmit a current across liquid metal channel 14 and through liquid metal 20.

FIG. 10 further illustrates an example embodiment where the example operational 1004 may include at least one additional operation. Additional operations may include an operation 1006, operation 1008, operation 1010 and/or operation 1012.

Operation 1006 illustrates transmitting a current from the device to an electrode. For example, as shown in FIGS. 8 and 9, device circuitry 34B-1 may transmit a current to one or more electrodes 24 of pump 18.

Operation 1008 illustrates inducing a velocity of the liquid metal associated with the current transmitted across the circuit board channel comprising the liquid metal. For example, as shown in FIGS. 8 and 9, electrodes 24 may transmit a current 38 across the liquid metal channel 14 and through liquid metal 20. The movement of current 38 may exert an electromagnetic force on the liquid metal 20 which may accelerate the liquid metal 20 to a velocity within the liquid metal channel 14.

Operation 1010 illustrates inducing a velocity in the liquid metal proportional to current usage of the device. For example, as shown in FIGS. 8 and 9, the current 38 may be an output current from device 16. As such, current 38 may be proportional to the current usage of the device 16. The resulting electromagnetic force on the liquid metal 20 (and corresponding velocity of the liquid metal 20) may be proportional to the current 38.

Operation 1012 illustrates transmitting a current from the device to a current shunt. For example, as shown in FIGS. 8 and 9, device circuitry 34B may transmit a current from the device 16 to a current shunt 36. The current shunt 36 may transmit a current via current shunt circuitry 34B-2 to the ground plane 32. The amount of current 38 transmitted across the liquid metal channel 14 and through liquid metal 20 may be modified through the transmission characteristics of the current shunt 36 so as to control the pumping velocity range of the pump 18.

Referring to FIG. 11, after a start operation, an exemplary operational flow 1100 moves to a transmitting operation 1102. Operation 1102 illustrates transmitting a current from the device across a circuit board channel comprising a liquid metal. For example, as shown in FIGS. 8 and 9, a pump 18 may transmit a current received from a power source (not shown) across liquid metal channel 14 and through liquid metal 20.

Operation 1104 illustrates, transmitting the current transmitted across the circuit board channel comprising a liquid metal to a device. For example, as shown in FIGS. 8 and 9, device circuitry 34B may transmit a current received from pump 18 to a device 16.

FIG. 11 further illustrates an example embodiment where the example operational 1102 may include at least one additional operation. Additional operations may include an operation 1106, operation 1108 and/or an operation 1110.

Operation 1106 illustrates transmitting a current to one or more electrodes. For example, as shown in FIGS. 8 and 9, one or more electrodes 24 of pump 18 may receive a current from a power source (not shown).

Operation 1108 illustrates inducing a velocity of the liquid metal associated with the current transmitted across the circuit board channel comprising the liquid metal. For example, as shown in FIGS. 8 and 9, electrodes 24 may transmit a current 38 across the liquid metal channel 14 and through liquid metal 20. The movement of current 38 may exert an electromagnetic force on the liquid metal 20 which may accelerate the liquid metal 20 to a velocity within the liquid metal channel 14.

Operation 1110 illustrates inducing a velocity in the liquid metal proportional to current usage of the device. For example, as shown in FIGS. 8 and 9, the current 38 may be an output current from device 16. As such, current 38 may be proportional to the current usage of the device 16. The resulting electromagnetic force on the liquid metal 20 (and corresponding velocity of the liquid metal 20) may be proportional to the current 38.

FIG. 11 further illustrates an example embodiment where the example operational 1104 may include at least one additional operation. Additional operations may include an operation 1112.

Operation 1112 illustrates powering the device with the current transmitted across the circuit board channel comprising a liquid metal. For example, as shown in FIGS. 8 and 9, device circuitry 34B may transmit a current from the pump 18 to the device 16. The device 16 may utilize the current received from the pump 18 to power its circuitry.

While the detailed drawings, specific examples, detailed algorithms and particular configurations given describe preferred and exemplary embodiments, they serve the purpose of illustration only. The embodiments disclosed may be not limited to the specific forms shown. For example, the methods may be performed in any of a variety of sequence of steps or according to any of a variety of mathematical formulas. The configurations shown and described may differ depending on the chosen performance characteristics and physical characteristics of the weather radar and processing devices. For example, the type of system components and their interconnections may differ. The systems and methods depicted and described may be not limited to the precise details and conditions disclosed. The flow charts show preferred exemplary operations only. The specific data types and operations are shown in a non-limiting fashion. Furthermore, other substitutions, modifications, changes, and omissions may be made in the design, operating conditions, and arrangement of the exemplary embodiments without departing from the scope of the application as expressed in the appended claims.

What is claimed is:
1. A circuit board, comprising:
   an electronic device operably coupled to current transmission circuitry, the electronic device being configured to operate based on current provided to the current transmission circuitry;
   an electrode operably coupled to the current transmission circuitry; and a channel comprising a liquid metal, the channel and liquid metal configured to transfer heat generated by the electronic device away from the electronic device, wherein the transmission circuitry is configured to transmit at least a portion of the received current from the device to the electrode; and wherein the electrode is configured to transmit the current received from the current transmission circuitry through the channel comprising the liquid metal.

2. The circuit board of claim 1, further comprising:
at least one magnet.

3. The circuit board of claim 2, wherein the liquid metal is pumped through the channel by a force generated by the one or more electrodes and one or more magnets.

4. The circuit board of claim 1, wherein the electronic device is disposed proximate to the channel comprising liquid metal.

5. The circuit board of claim 1, wherein the liquid metal comprises one or more of gallium, indium, tin, bismuth, lead, sodium and potassium.

6. The circuit board of claim 1, further comprising:
at least one current shunt.

7. The circuit board of claim 6, further comprising:
a ground plane,
wherein the at least one current shunt is operably coupled to the ground plane.

8. A method comprising:
transmitting a current to a device;
transmitting at least a portion of the current received by the device from the device across a circuit board channel comprising a liquid metal;
wherein the channel and liquid metal are configured to transfer heat generated by the device away from the device.

9. The method of claim 8, wherein the transmitting a current from the device across a circuit board channel comprising a liquid metal further comprises:
transmitting a current from the device to an electrode.

10. The method of claim 8, further comprising:
inducing a velocity of the liquid metal associated with the current transmitted across the circuit board channel comprising the liquid metal.

11. The method of claim 10, wherein the inducing a velocity of the liquid metal associated with the current transmitted across the circuit board channel comprising the liquid metal further comprises:
inducing a velocity in the liquid metal proportional to current usage of the device.

12. The method of claim 8, further comprising:
transmitting a current from the device to a current shunt.

13. A method comprising:
transmitting a current across a circuit board channel comprising a liquid metal; and
transmitting the current transmitted across the circuit board channel comprising the liquid metal to a device;
wherein the channel and liquid metal are configured to transfer heat generated by the device away from the device.

14. The method of claim 13, wherein the transmitting the current transmitted across the circuit board channel comprising a liquid metal to a device further comprises:
transmitting a current to one or more electrodes.

15. The method of claim 13, further comprising:
inducing a velocity of the liquid metal associated with the current transmitted across the circuit board channel comprising the liquid metal.

16. The method of claim 15, wherein the inducing a velocity of the liquid metal associated with the current transmitted across the circuit board channel comprising the liquid metal further comprises:
inducing a velocity in the liquid metal proportional to current usage of the device.

17. The method of claim 13, further comprising:
powering the device with the current transmitted across the circuit board channel comprising a liquid metal.

* * * * *